US009288926B2

(12) United States Patent
Masuda

(10) Patent No.: US 9,288,926 B2
(45) Date of Patent: Mar. 15, 2016

(54) STRUCTURE FOR HOLDING ELECTRIC/ELECTRONIC COMPONENT WITH ELECTRIC WIRE

(71) Applicant: YAZAKI CORPORATION, Tokyo (JP)

(72) Inventor: Satoki Masuda, Kakegawa (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 14/670,828

(22) Filed: Mar. 27, 2015

(65) Prior Publication Data
US 2015/0282369 A1    Oct. 1, 2015

(30) Foreign Application Priority Data

Mar. 28, 2014  (JP) .................................. 2014-067562

(51) Int. Cl.
| | | |
|---|---|---|
| H01R 13/72 | (2006.01) | |
| H05K 7/02 | (2006.01) | |
| H01R 13/00 | (2006.01) | |
| H01R 9/03 | (2006.01) | |
| H01R 25/16 | (2006.01) | |
| H01R 4/34 | (2006.01) | |
| H01R 13/506 | (2006.01) | |
| H01R 13/66 | (2006.01) | |

(52) U.S. Cl.
CPC .. *H05K 7/02* (2013.01); *H01R 9/03* (2013.01); *H01R 13/00* (2013.01); *H01R 25/162* (2013.01); *H01R 4/34* (2013.01); *H01R 13/506* (2013.01); *H01R 13/6683* (2013.01); *H01R 2201/26* (2013.01)

(58) Field of Classification Search
CPC ..... H02K 5/10; H02K 5/225; H02K 11/0073; H01R 43/20
USPC .......................... 439/701, 709, 501, 596, 345
See application file for complete search history.

(56) References Cited

U.S. PATENT DOCUMENTS

| | | | | |
|---|---|---|---|---|
| 5,469,844 A | * | 11/1995 | Rogler | ................. A61B 5/0444 206/305 |
| 7,500,867 B1 | * | 3/2009 | Doglio | ............... H01R 13/5812 248/251 |
| 8,194,396 B2 | * | 6/2012 | Kano | ..................... H02G 11/00 361/623 |

(Continued)

FOREIGN PATENT DOCUMENTS

JP         2011-60438 A      3/2011

*Primary Examiner* — Briggitte R Hammond
*Assistant Examiner* — Milagros Jeancharles
(74) *Attorney, Agent, or Firm* — Sughrue Mion, PLLC

(57) ABSTRACT

A structure for holding an electric/electronic component with an electric wire includes a component holding portion provided in a housing to hold the electric/electronic component. The component holding portion includes: a holding arm portion including a moving-direction extending arm portion extending in a direction in which the electric/electronic component is moved to be installed in the housing through an attachment port defined on a side corresponding to one side surface of the electric/electronic component and on a front end side of the holding arm portion; and an electric wire pressing wall portion defining a gap between the electric wire pressing wall portion and the holding arm portion. In a state in which the electric/electronic component is installed in the housing, the electric wire is disposed to expand the gap to deform the holding arm such that the moving-direction extending arm portion presses the one side surface.

4 Claims, 12 Drawing Sheets

(56) References Cited

U.S. PATENT DOCUMENTS

| | | | |
|---|---|---|---|
| 8,221,158 B2* | 7/2012 | Liao | H01R 13/60 439/535 |
| 8,342,880 B2* | 1/2013 | Kato | H01R 9/032 439/382 |
| 8,408,943 B2* | 4/2013 | Okamoto | H01R 13/6593 439/607.41 |
| 8,545,260 B2* | 10/2013 | Zhou | H01R 13/72 191/12.4 |
| 8,870,601 B2* | 10/2014 | Lee | H01R 31/06 439/131 |
| 2002/0106933 A1* | 8/2002 | Lee | H01R 13/72 439/501 |
| 2012/0164867 A1 | 6/2012 | Matsumoto et al. | |

* cited by examiner

STRUCTURE FOR HOLDING ELECTRIC/ELECTRONIC COMPONENT WITH ELECTRIC WIRE

CROSS REFERENCE TO RELATED APPLICATION(S)

This application is based on and claims priority from Japanese Patent Application (Application No. 2014-067562) filed on Mar. 28, 2014, the entire contents of which are incorporated herein by reference.

BACKGROUND

1. Field of the Invention

The present invention relates to a structure for holding an electric/electronic component with an electric wire by a housing.

2. Description of the Related Art

In an electric/electronic component including a component body to which an electric wire is attached, a moving direction in which the component is moved to be installed in a housing as an installation destination is defined in accordance with the installation of other components.

For example, JP-A-2011-60438 describes a structure for holding an electric/electronic component with an electric wire, in which, when a current sensor is installed in a housing as the electric/electronic component with the electric wire, the current sensor is installed in the housing while a terminal fitting is inserted into a measurement hole.

In such a structure for holding an electric/electronic component with an electric wire, a component holding portion serving as a part for holding the electric/electronic component with the electric wire is generally provided in the housing.

The component holding portion slides on a component body when the component body is moved to be installed in the housing. Thus, the component holding portion is bent and deformed in a direction in which the component holding portion can expand the movable space of the component body. When the component body is disposed in an installation position, the component holding portion is elastically restored toward the component body so as to hold the component body. Such a structure is often used.

SUMMARY

However, in the above-described structure for holding an electric/electronic component with an electric wire, in order to enhance the force with which the component body can be held by the component holding portion, a pressing force applied to the component body from the component holding portion increases when the component body is moved to be installed in the holding. It is therefore difficult to install the component body in the housing. In addition, in the structure for holding an electric/electronic component with an electric wire, the work of installation in the housing is further complicated by the fact that not only the component body but also the electric wire must be held in the housing.

The present invention has been made in view of the above-described circumstances, and an object thereof is to provide a structure for holding an electric/electronic component with an electric wire, in which the electric/electronic component with the electric wire can be installed in a housing easily while the electric/electronic component with the electric wire can be held in the housing with an enhancing holding force.

In a first aspect, there is provided a structure for holding an electric/electronic component with an electric wire by a housing, the electric/electronic component including a component body to which the electric wire is attached, the structure including: a component holding portion provided in the housing to hold the electric/electronic component, wherein the component holding portion includes: a holding arm portion including a moving-direction extending arm portion having an arm shape extending in a moving direction in which the component body is moved to be installed in the housing through an attachment port for the component body defined on a side corresponding to one side surface of the component body and on a front end side of the holding arm portion; and an electric wire pressing wall portion including a wall which defines a gap between the electric wire pressing wall portion and the holding arm portion to allow the electric wire to be inserted and disposed, and wherein in a state in which the electric/electronic component is installed in the housing, the component body is placed in an installation position, and the electric wire is disposed to expand the gap, whereby the holding arm is deformed such that the moving-direction extending arm portion presses the one side surface.

In a second aspect, there is provided the structure for holding an electric/electronic component with an electric wire according to the first aspect, wherein the holding arm portion further includes: a continuous arm portion which is bent with respect to the moving-direction extending arm portion on a rear side opposite to the front end side in the moving direction and which has an arm shape continuous to the moving-direction extending arm portion, wherein the gap is formed between the electric wire pressing wall portion and the continuous arm portion, and wherein in the state in which the electric/electronic component is installed in the housing, the electric wire disposed in the gap presses the continuous arm portion to incline the continuous arm portion toward the component body such that the moving-direction extending arm portion presses the one side surface of the component body.

In a third aspect, there is provided the structure for holding an electric/electronic component with an electric wire according to the first or second aspect, wherein a distance between the holding arm portion and the electric wire pressing wall portion forming the gap is adjusted to be smaller than an outer diameter of the electric wire.

In a fourth aspect, there is provided a structure for holding an electric/electronic component with an electric wire according to any one of the first to third aspects, wherein a conductive member including an electric connection portion to be electrically connected to a connection counterpart is installable in the housing, wherein the electric/electronic component includes a current sensor which has a measurement hole which is formed to penetrate the component body in the moving direction and to which the electric connection portion is inserted for measuring an electric current of the electric connection portion, and wherein in the state in which the component body is installed in the housing, the electric connection portion is inserted into the measurement hole.

In the structure for holding an electric/electronic component with an electric wire according to the first aspect, when the electric/electronic component with the electric wire is installed in the housing, the component body is disposed in an installation position, and the electric wire is then disposed to expand the gap, whereby the holding arm portion is deformed such that the moving-direction extending arm portion presses the one side surface. Accordingly, when the component body is moving to the installation position, the force with which the moving-direction extending arm portion presses the one side surface can be adjusted to be small enough not to interfere with the installation. When the electric wire to be held in the housing together with the component body is installed in the housing, the holding force by the moving-direction extending arm portion can be enhanced. Thus, the electric/electronic component with the electric wire can be installed in the housing easily and held in the housing with the enhanced holding force.

In the structure for holding an electric/electronic component with an electric wire according to the second aspect, the component body can be held by the holding arm portion such that a plurality of faces of the component body are surrounded by the moving-direction extending arm portion and the continuous arm portion. Accordingly, the component body can be held while the effect of suppressing backlash of the component body can be enhanced by the holding arm portion.

In the structure for holding an electric/electronic component with an electric wire according to the third aspect, the gap can be expanded surely by the electric wire which is a single wire. Accordingly, the installation can be made easy.

In the structure for holding an electric/electronic component with an electric wire according to the fourth aspect, when the current sensor having the measurement hole to which the conductive member is inserted is used as the electric/electronic component with the electric wire, the direction in which the component body of the current sensor is moved to be installed is a direction in which the conductive member is inserted into the insertion hole. When the component body is moved to an installation position, the force with which the moving-direction extending arm portion presses the one side surface can be adjusted to be small enough not to interfere with the installation. When the electric wire to be held in the housing together with the component body is installed in the housing, the holding force by the moving-direction extending arm portion can be enhanced. Thus, the current sensor can be installed in the housing easily and held in the housing with the enhanced holding force.

DETAILED DESCRIPTION

An embodiment of a structure for holding an electric/electronic component with an electric wire according to the invention will be described below in detail with reference to the drawings.

Embodiment

Figure 1:
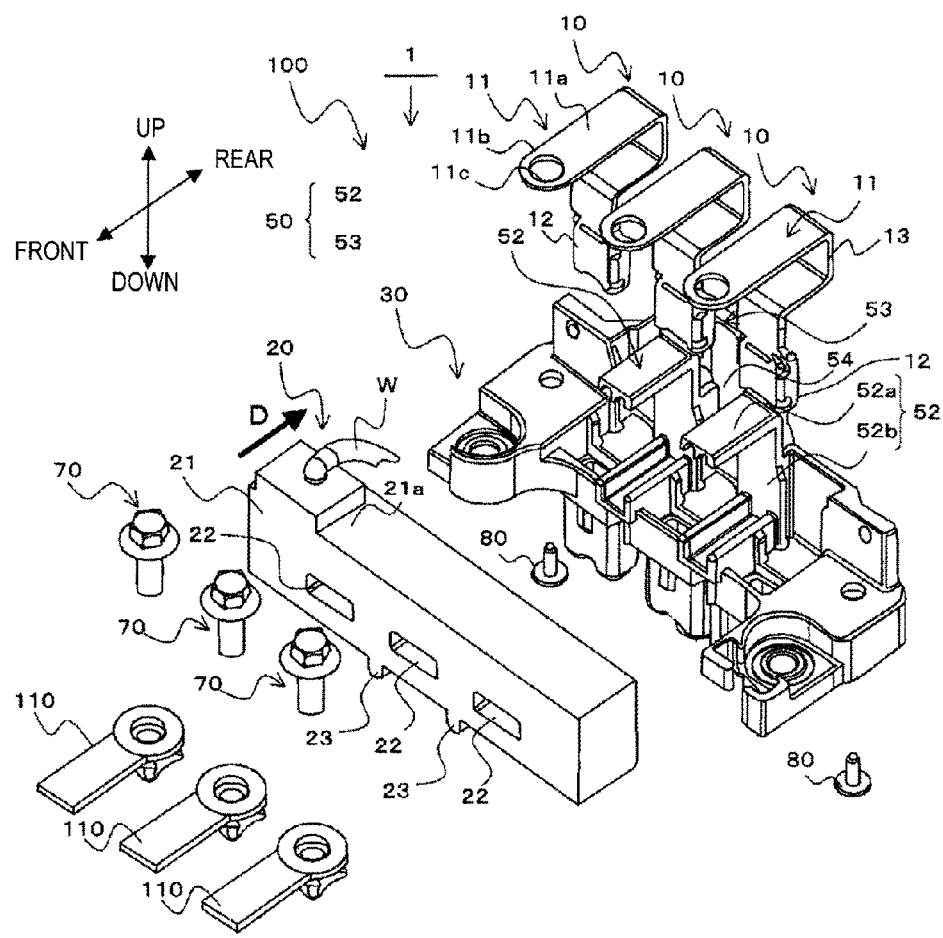
FIG. 1 is an exploded perspective view of a connector in which a structure for holding an electric/electronic component with an electric wire according to an embodiment of the invention is installed.
Figure 2:
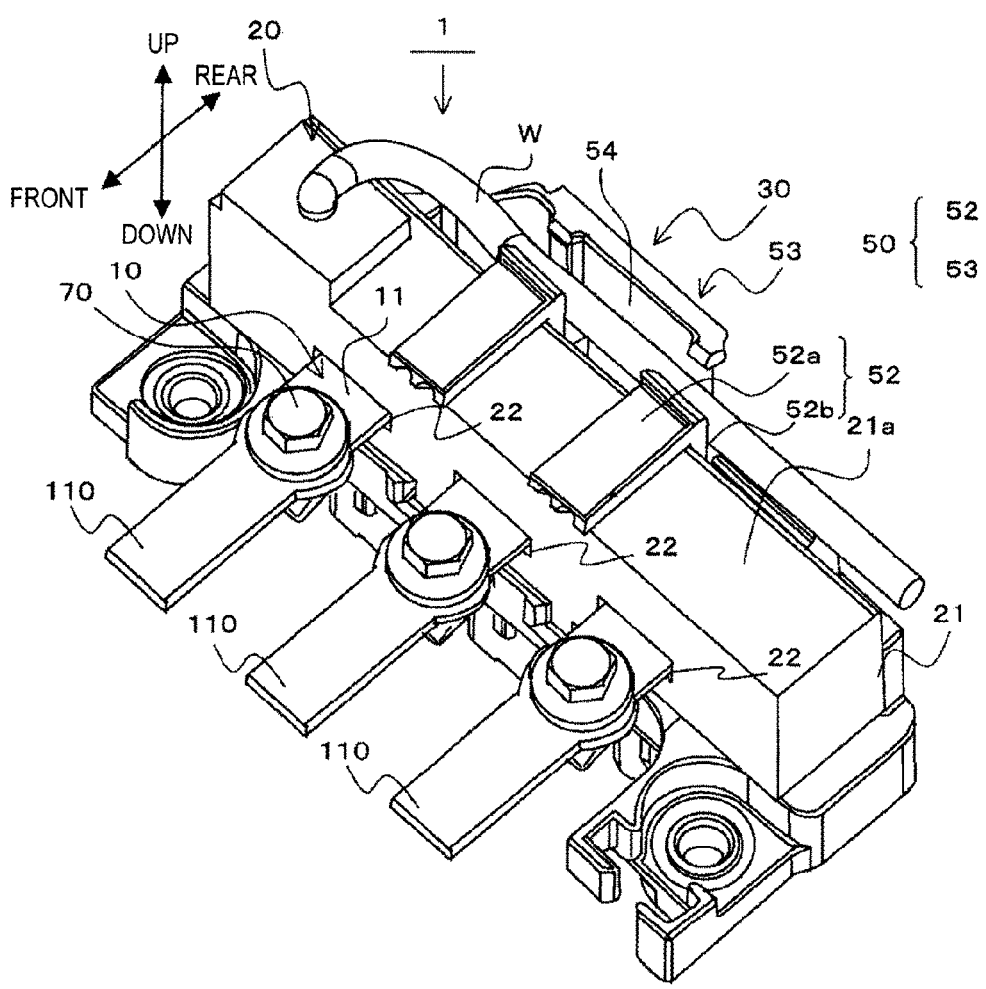
FIG. 2 is a perspective view of the connector shown in FIG. 1.
Figure 3:
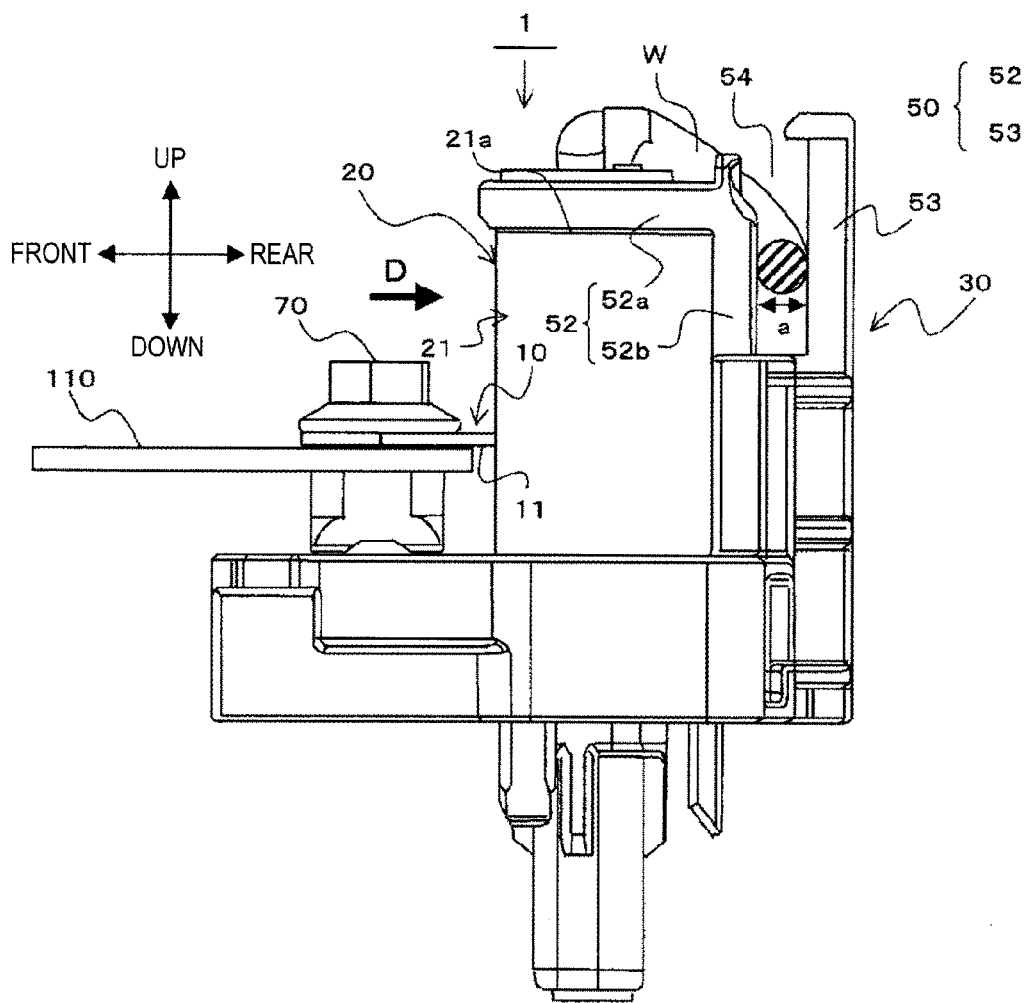
FIG. 3 is a side view of the connector shown in FIG. 1.
Figure 4:
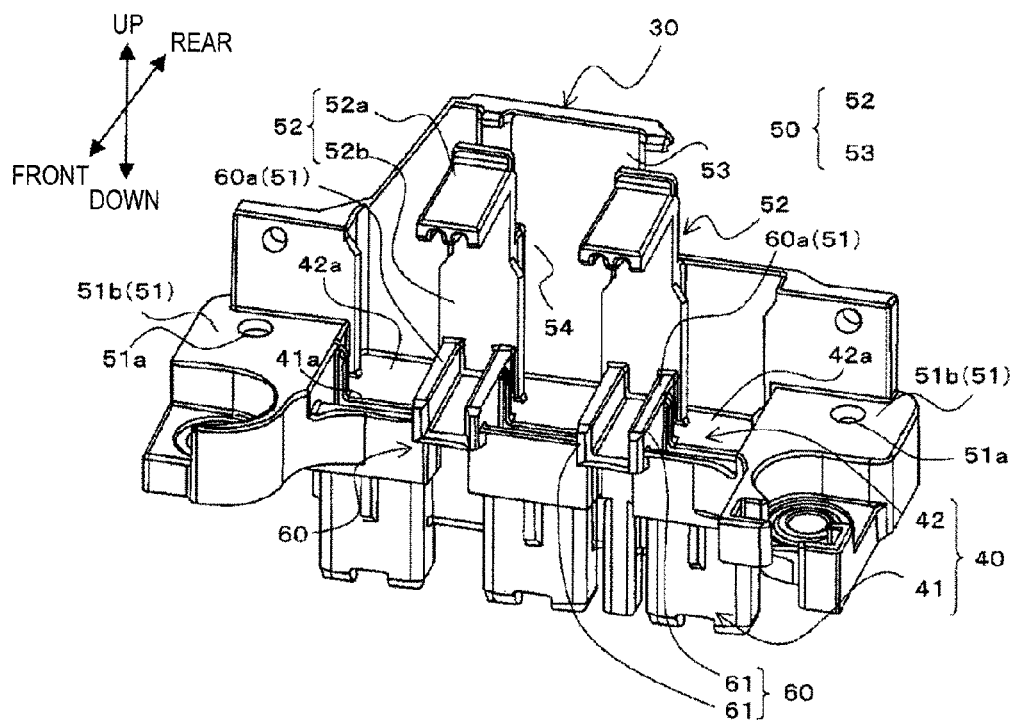
FIG. 4 is a perspective view of a housing shown in FIG. 1.
Figure 5:
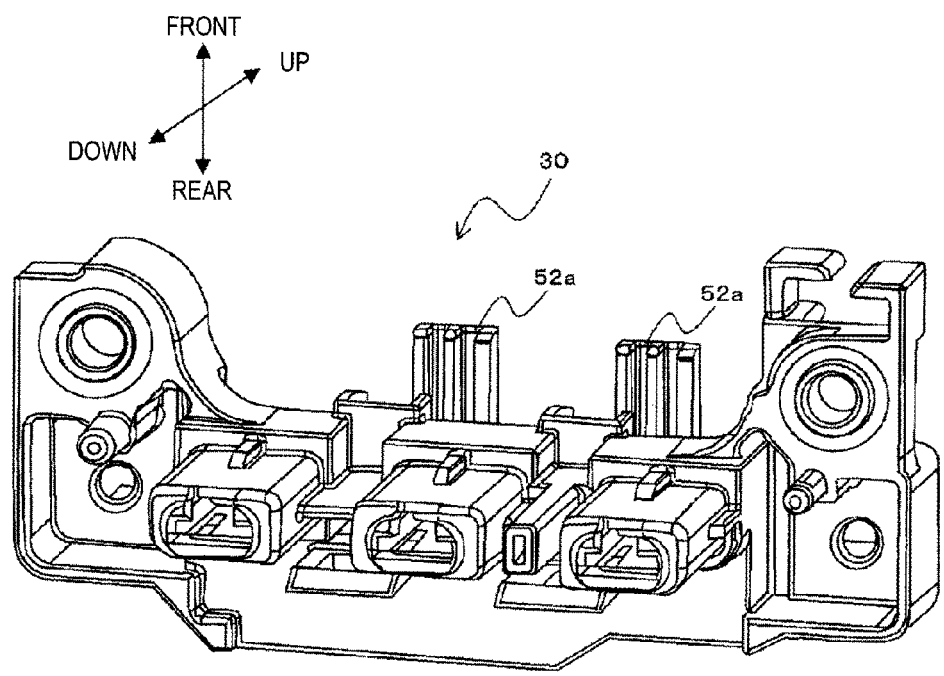
FIG. 5 is a view in which the housing shown in FIG. 1 is observed obliquely from below.
Figure 6:
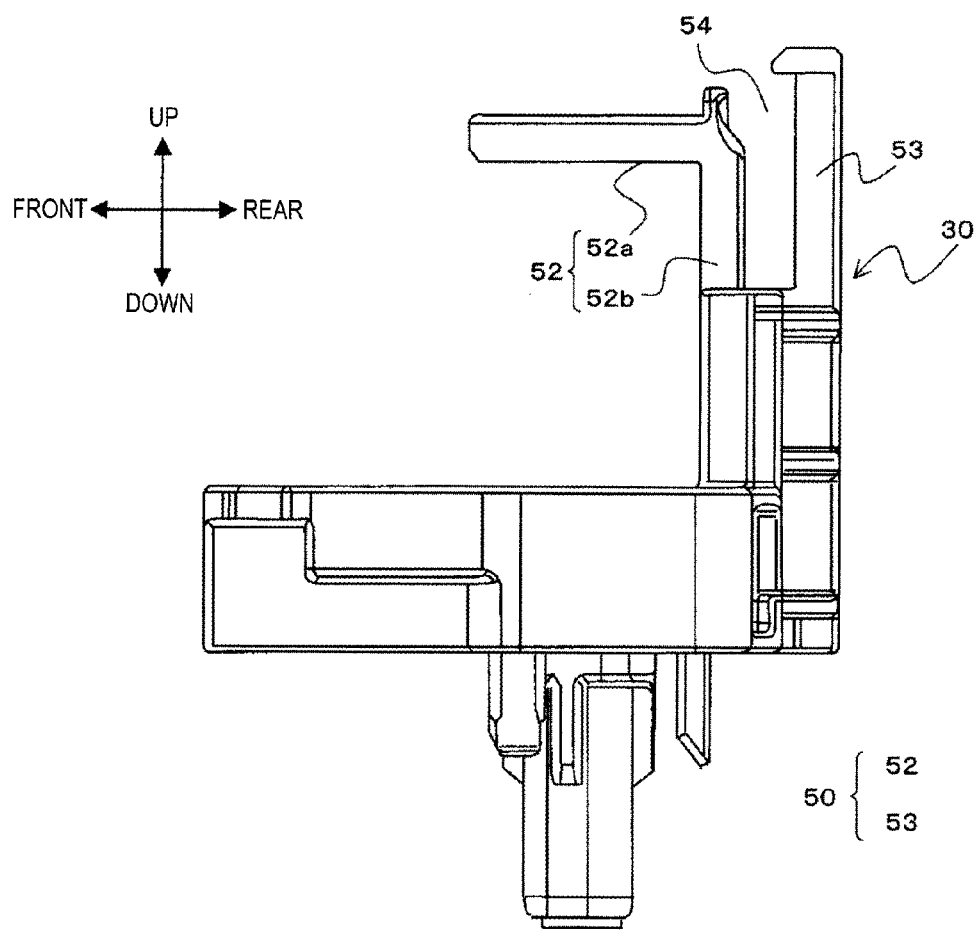
FIG. 6 is a side view of the housing shown in FIG. 1.
Figure 7:
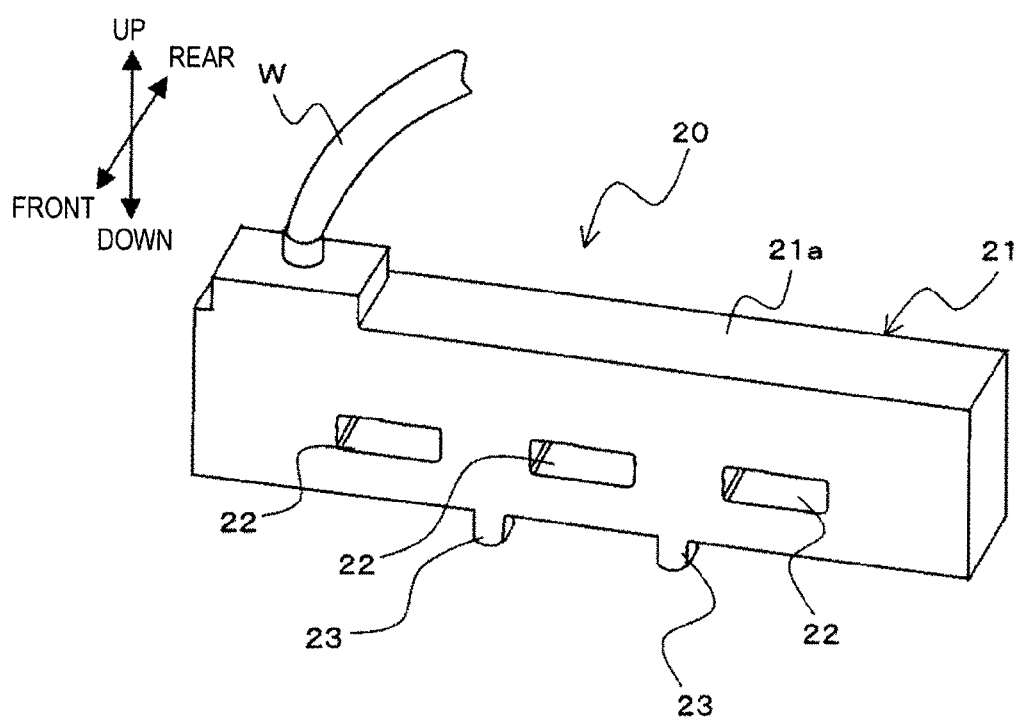
FIG. 7 is a perspective view of a current sensor shown in FIG. 1.
Figure 8:
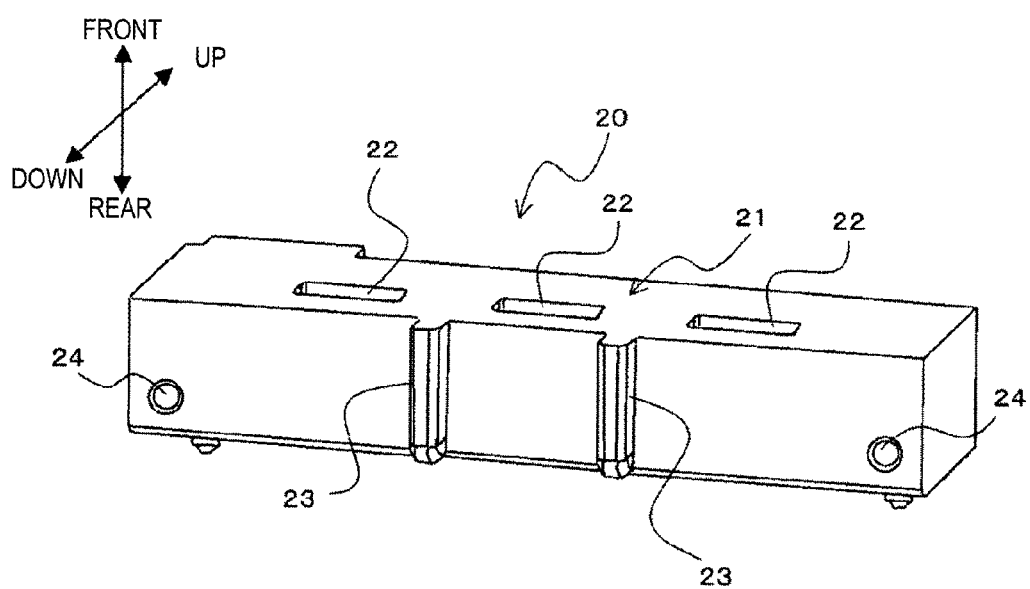
FIG. 8 is a view in which the current sensor shown in FIG. 1 is observed obliquely from below.
Figure 9:
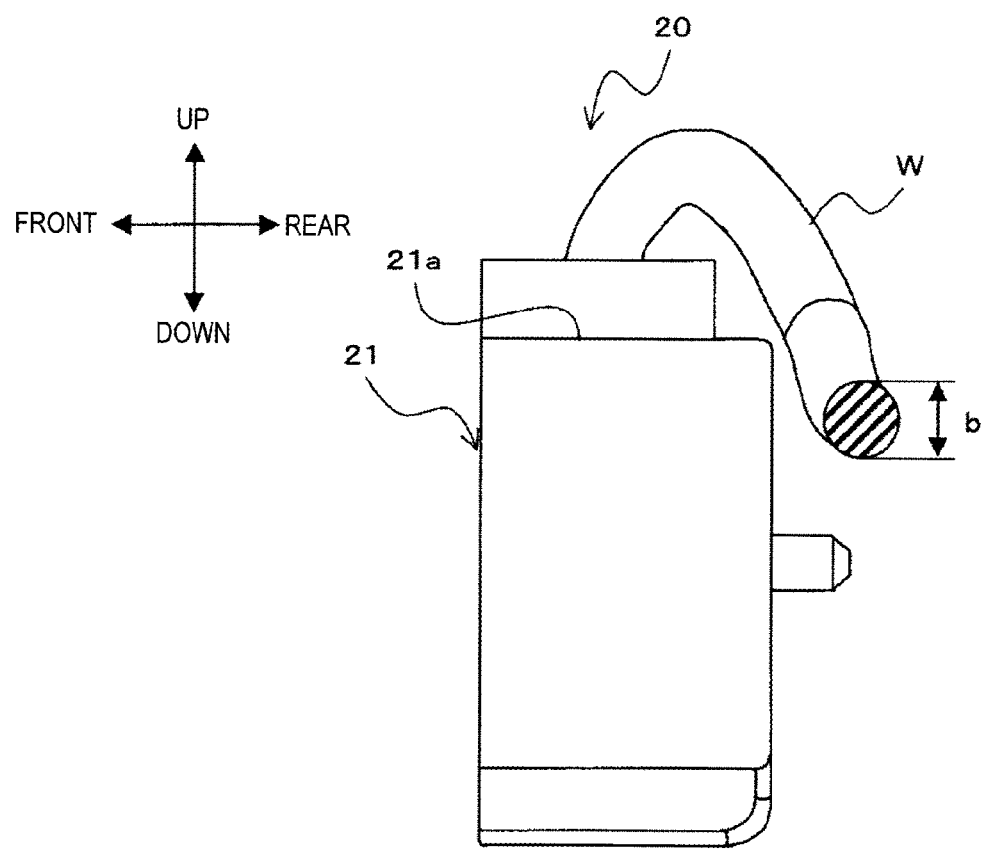
FIG. 9 is a side view of the current sensor shown in FIG. 1, in which the electric wire is depicted in section.

FIG. 1 is an exploded perspective view of a connector 100 in which a structure 1 for holding an electric/electronic component with an electric wire according to an embodiment of the invention is installed. FIG. 2 is a perspective view of the connector 100 shown in FIG. 1. FIG. 3 is a side view of the connector 100 shown in FIG. 1. FIG. 4 is a perspective view of a housing 30 shown in FIG. 1. FIG. 5 is a view in which the housing 30 shown in FIG. 1 is observed obliquely from below. FIG. 6 is a side view of the housing 30 shown in FIG. 1. FIG. 7 is a perspective view of a current sensor 20 shown in FIG. 1. FIG. 8 is a view in which the current sensor 20 shown in FIG. 1 is observed obliquely from below. FIG. 9 is a side view of the current sensor 20 shown in FIG. 1, in which an electric wire W is depicted in section.

In the embodiment of the invention, the front, rear, up and down directions are defined as depicted in the drawings for convenience of explanation.

The structure 1 for holding an electric/electronic component with an electric wire according to the embodiment of the invention is, for example, installed in the connector 100 which will be attached to a device for a car.

The connector 100 is connected to bus bars 110 provided in a not-shown device as an attachment destination, and connected to a not-shown counterpart connector including an electric wire such as a wire harness wired in a car through counterpart connector fitting portions 41 provided in the housing 30.

The connector 100 includes three terminals 10, the current sensor 20 and the housing 30. The terminals 10 serve as conductive members including electric connection portions that can be fastened to the bus bars 110, which are connection counterparts to be electrically connected, through bolts 70 respectively. The current sensor 20 serves as an electric/electronic component with an electric wire. Electric connection portions 11 are inserted into measurement holes 22 of a component body 21 so as to measure electric currents in the terminals 10 respectively. The three terminals 10 and the current sensor 20 are installed in the housing 30.

The structure 1 for holding an electric/electronic component with an electric wire is a structure in which the current sensor 20 including an electric wire W attached to the component body 21 is held by the housing 30 including component holding portions 50 serving as parts for holding the current sensor 20.

The connector 100 will be described below in order to explain each portion of the structure 1 for holding an electric/electronic component with an electric wire.

Each terminal 10 is formed by punching or bending applied to a plate-shaped conductive member. An electric connection portion 11 that will be fastened to a bus bar 110 through a bolt 70 is provided in one end portion of the terminal 10 while a female terminal portion 12 that will be connected to a male terminal provided in a not-shown counterpart connector is provided in the other end portion.

In addition, the terminal 10 has an intermediate portion 13, which connects the electric connection portion 11 and the female terminal portion 12 with each other.

The electric connection portion 11 includes an insertion portion 11a that is inserted into a measurement hole 22 of the current sensor 20 in order to measure an electric current, and a bolt fastening portion 11b that is a front end portion exposed from the measurement hole 22. In the bolt fastening portion 11b, a bolt insertion hole 11c is formed so that a bus bar 110 can be fastened thereto by a bolt 70.

The current sensor 20 includes a component body 21 that forms a body part, and an electric wire W that is attached to the component body 21.

The component body 21 has a substantially rectangular parallelepiped shape, whose enclosure is formed out of an insulating material such as synthetic resin. The component body 21 includes measurement holes 22, guide protrusion portions 23 and threaded holes 24.

The measurement holes 22 are holes to which the electric connection portions 11 are inserted to measure electric currents in the electric connection portions 11. The measurement holes 22 have rectangular shapes corresponding to the sectional outer shapes of the electric connection portions 11. The measurement holes 22 are arranged at three places in the longitudinal direction of the component body 21.

The guide protrusion portions 23 are provided to protrude from the lower surface of the component body 21.

The guide protrusion portions 23 are arranged at two places and at a distance from each other in a direction perpendicular to the direction in which the component body 21 will be moved to be installed in the housing 30 (hereinafter referred to as installation movement direction D).

The threaded holes 24 are holes to which screws 80 are attached for fixing the component body 21 to the housing 30. The threaded holes 24 are formed in positions corresponding to fixation holes 51a of the housing 30 which will be described later.

The housing 30 is made of an insulating material such as synthetic resin. The housing 30 includes three terminal mounting portions 40 in which the terminals 10 are disposed respectively, component holding portions 50 that serve as parts for holding the current sensor 20, and guide wall portions 60 that guide the component body 21 to an installation position of the housing 30.

Each terminal mounting portion 40 has a counterpart connector fitting portion 41 in which a female terminal portion 12 is disposed so that the female terminal portion 12 can be connected to a male terminal of a counterpart connector, and an intermediate portion mounting portion 42 in which an intermediate portion 13 is disposed.

The counterpart connector fitting portion 41 has a hood shape in which a terminal insertion port 41a for the female terminal portion 12 is formed on the side of a terminal mounting surface 42a which will be described later. Inside the counterpart connector fitting portion 41, the female terminal portion 12 is disposed to protrude in the direction in which the counterpart connector fitting portion 41 protrudes.

The intermediate portion mounting portion 42 has a terminal mounting surface 42a on which a part of the intermediate portion 13 is mounted.

When the terminal 10 is disposed in the terminal mounting portion 40 configured thus, the female terminal portion 12 is pushed into the counterpart connector fitting portion 41 from the terminal insertion port 41a until the intermediate portion 13 abuts against the terminal mounting surface 42a.

Each component holding portion 50 includes a component mounting surface 51 on which the component body 21 is mounted, a holding arm portion 52 and an electric wire pressing wall portion 53.

The component mounting surface 51 is a surface on which one of the longitudinally opposite end portions of the component body 21 is mounted. The component mounting surface 51 is constituted by a component end portion mounting surface 51b in which a fixation hole 51a is formed for fixing the component body 21 by screwing, and upper edge surfaces 60a of guide walls 61 which will be described later.

The holding arm portion 52 includes a moving-direction extending arm portion 52a and a continuous arm portion 52b. The moving-direction extending arm portion 52a extends having an arm shape extending in the installation movement direction D through an attachment port for the component body 21 defined on the front end side and on one side surface (upper surface 21a) side of the component body 21 (a side corresponding to one side surface of the component body 21). The continuous arm portion 52b is bent with respect to the moving-direction extending arm portion 52a on the deep (rear) side in the installation movement direction D of the component body 21 disposed in the installation position of the housing 30.

The moving-direction extending arm portion 52a extends in parallel to the electric connection portion 11. Therefore, when the component body portion 21 is moving to the installation position of the housing 30 while the electric connection portion 11 is inserted into the measurement hole 22, the moving-direction extending arm portion 52a serves to guide the component body portion 21 to thereby prevent the component body portion 21 from chattering in the up/down direction.

Thus, when the current sensor 20 is installed in the housing 30, the moving-direction extending arm portion 52a prevents the electric connection portion 11 from contacting the hole inner surface of the measurement hole 22, resulting in preventing the current sensor 20 from being damaged.

The continuous arm portion 52b is bent substantially perpendicularly to and continuously to the moving-direction extending arm portion 52a so that the continuous arm portion 52b can be elastically inclined toward the component body 21.

The holding arm portion 52 configured thus holds the component body 21 in such a manner that a plurality of faces of the component body 21 are surrounded by the moving-direction extending arm portion 52a and the continuous arm portion 52b.

Incidentally, the two holding arm portions 52 are provided at a distance from each other in a direction perpendicular to the installation movement direction D of the component body 21.

The electric wire pressing wall portion 53 consists of a wall that is provided so that a gap 54 where the electric wire W is inserted and disposed can be formed between the electric wire pressing wall portion 53 and the holding arm portion 52. More specifically, the electric wire pressing wall portion 53 is a wall that is provided so that a gap 54 where the electric wire W is inserted and disposed to press the continuous arm portion 52b can be formed between the electric wire pressing wall portion 53 and the holding arm portion 52.

A distance a (see FIG. 3) between the continuous arm portion 52b and the electric wire pressing wall portion 53 forming the gap 54 is adjusted to be smaller than an outer diameter b (see FIG. 9) of the electric wire W.

When the current sensor 20 is installed in the housing 30, the component body 21 is disposed in the installation position of the housing 30, and the electric wire W is disposed in the gap 54. As a result, the continuous arm portions 52b are inclined toward the component body 21 due to a pressing force by the electric wire W so that the moving-direction extending arm portions 52a press the one side surface 21a of the component body 21. Thus, the component body 21 can be held surely in the installation position of the housing 30.

Each guide wall portion 60 consists of a pair of guide walls 61. The guide walls 61 are provided to face each other at a distance slightly larger than the width of each guide protrusion portion 23 and to extend in the installation movement direction D of the component body 21. Thus, the guide walls 61 can guide the component body 21 to the installation position while the guide protrusion portion 23 is put between the guide walls 61. The guide wall portions 60 are provided at two places correspondingly to the two guide protrusion portions 23.

Next, the procedure of installation of the connector 100 will be described with reference to FIGS. 10A and 10B and FIGS. 11A and 11B.

Figure 10A:
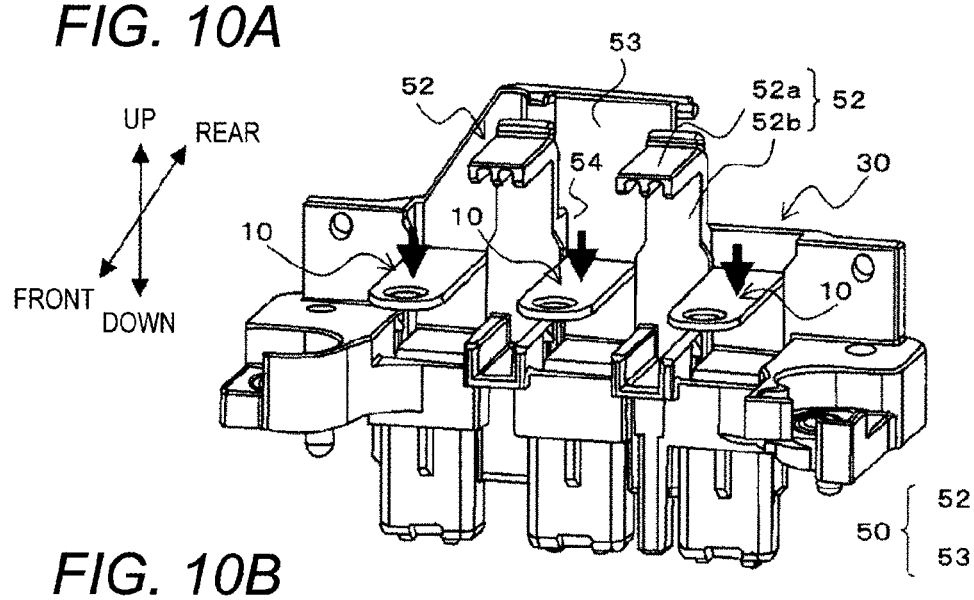
FIG. 10A is a perspective view of an assembly in which terminals are installed in the housing.
Figure 10B:
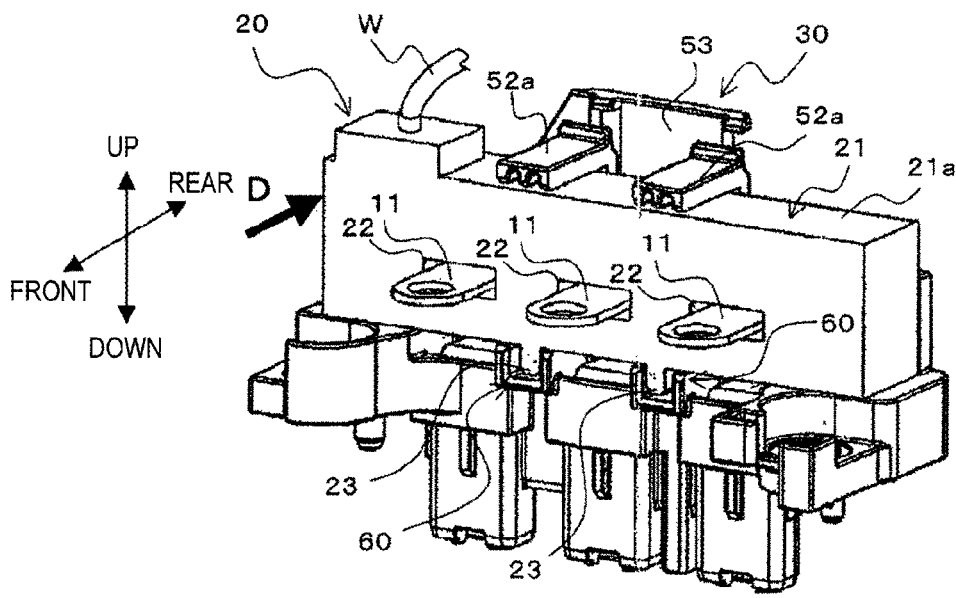
FIG. 10B is a perspective view of the assembly in which the current sensor is further installed in the housing of the assembly shown in FIG. 10A.
Figure 11A:
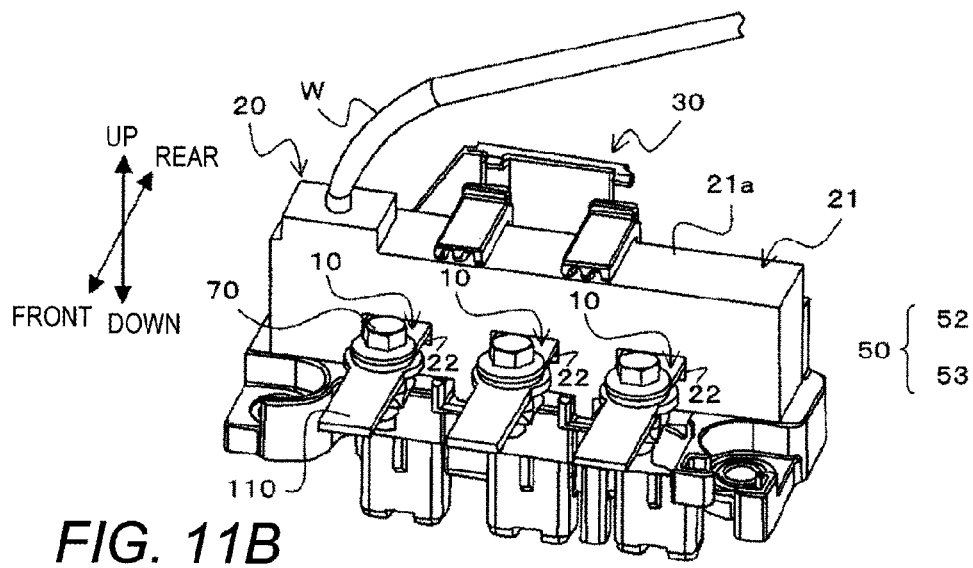
FIG. 11A is a perspective view of the assembly in which the terminals are fastened to bus bars by bolts respectively in the assembly shown in FIG. 10B.
Figure 11B:
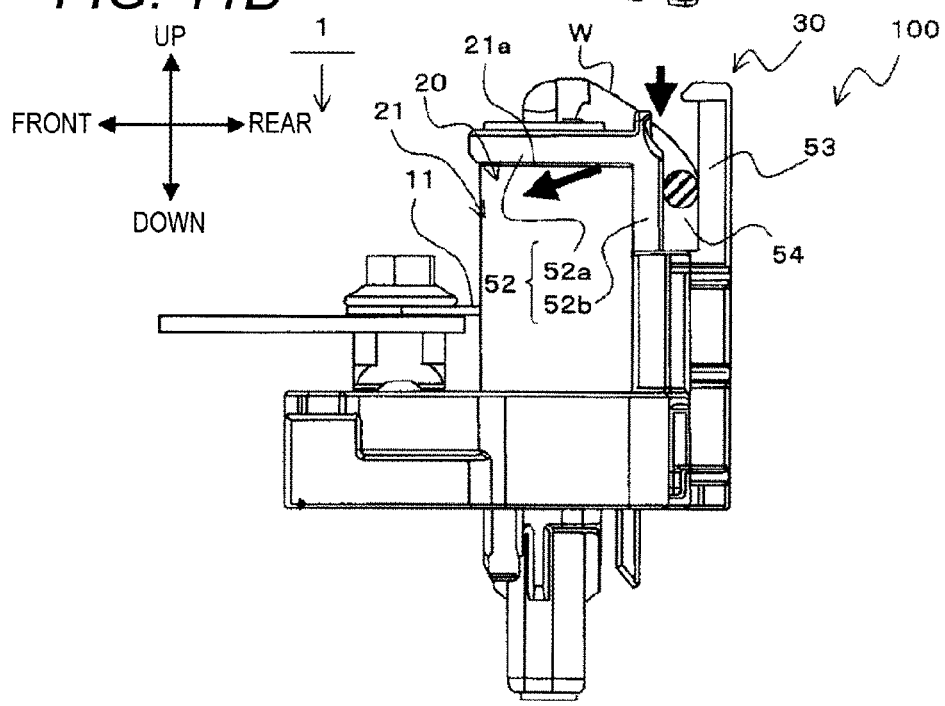
FIG. 11B is a perspective view of the connector in which assembling has been completed.

FIG. 10A is a perspective view of an assembly in which the terminals 10 are installed in the housing 30, and FIG. 10B is a perspective view of the assembly in which the current sensor 30 is further installed in the housing 30 of the assembly shown in FIG. 10A. FIG. 11A is a perspective view of the assembly in which the terminals 10 are fastened to bus bars 110 by bolts respectively in the assembly shown in FIG. 10B, and FIG. 11B is a perspective view of the connector 100 in which assembling has been completed.

First, a worker installs the three terminals 10 in the housing 30 (see FIG. 10A). Here, the female terminal portions 12 are disposed in the counterpart connector fitting portions 41, and the intermediate portions 13 are mounted on the terminal mounting surfaces 42a.

After that, the worker installs the component body 21 of the current sensor 20 in the housing 30 (see FIG. 10B). Here, in the component body 21, the electric connection portions 11 of the terminals 10 are inserted into the measurement holes 22 respectively, and the two guide protrusion portions 23 are fitted between the paired guide walls 61 of the corresponding guide wall portions 60 respectively. Further, the component body 21 is inserted into a space surrounded by the two moving-direction extending arm portions 52a and the upper edge surfaces 60a of the guide walls 61 from the front end sides of the two moving-direction extending arm portions 52a, and moved to the installation position of the housing 30 in that state.

When moving the component body 21 to the installation position in this manner, the worker fixes the component body 21 to the housing 30 by the screws 80.

On this occasion, the component body 21 is disposed in the installation position while being positioned by the guide protrusion portions 23 and the guide wall portions 60. Thus, the threaded holes 24 of the component body 21 can be aligned with the fixation holes 51a of the housing 30 easily.

In addition, the component body 21 moves to the installation position while being prevented from chattering in the up/down direction by the moving-direction extending arm portions.

After that, the worker fastens the terminals 10 to the bus bars 110 by bolts respectively (see FIG. 11A).

After that, the worker disposes the electric wire W in the gap 54 and completes the installation of the connector 100 (see FIG. 11B). Here, when disposing the electric wire W in the gap 54, the worker pushes the electric wire W into the gap 54 to expand the width of the gap 54.

As a result, the continuous arm portions 52b are inclined toward the component body 21 due to the pressing force by the electric wire W so that the moving-direction extending arm portions 52b can press the upper surface (one side surface) 21a of the component body 21.

Due to a series of installation working in which the component body 21 is installed in the housing 30 and the electric wire W is installed in the housing 30 in this manner, the component body 21 can be held in the housing 30 with a high holding force.

In the structure 1 for holding an electric/electronic component with an electric wire according to the embodiment of the invention, when the current sensor 20 is installed in the housing 30, the component body 21 is disposed in an installation position, and the electric wire W is then disposed to expand the gap 54 so that the holding arm portions 52 can be deformed to press the moving-direction extending arm portions 52a onto the one side surface 21a of the component body 21. Accordingly, when the component body 21 is moving to the installation position, the force with which the moving-direction extending arm portions 52a are pressed onto the one side surface 21a can be adjusted to be small enough not to interfere with the installation. When the electric wire W to be held in the housing 30 together with the component body 21 is installed in the housing 30, the holding force by the moving-direction extending arm portions 52a can be enhanced. Thus, the current sensor 20 can be installed in the housing 30 easily and held in the housing 30 with the enhanced holding force.

In addition, in the structure 1 for holding an electric/electronic component with an electric wire according to the embodiment of the invention, the component body 21 can be held by the holding arm portions 52 in such a manner that a plurality of faces of the component body 21 are surrounded by the moving-direction extending arm portions 52a and the continuous arm portions 52b. Accordingly, the component body 21 can be held while the effect of suppressing backlash of the component body 21 can be enhanced by the holding arm portions 52.

In addition, in the structure 1 for holding an electric/electronic component with an electric wire according to the embodiment of the invention, the gap 54 can be expanded surely by the electric wire W which is a single wire. Accordingly, the installation can be made easy.

In addition, in the structure 1 for holding an electric/electronic component with an electric wire according to the embodiment of the invention, when the current sensor 20 including the conductive members 10 to be inserted into the measurement holes 22 is used as the electric/electronic component with the electric wire, the direction in which the component body 21 is moved to be installed in the housing 30 is a direction in which the conductive members 10 are inserted into the insertion holes 22. When the component body 21 is moving to an installation position, the force with which the moving-direction extending arm portions 52a are pressed onto the one side surface 21a can be adjusted to be small enough not to interfere with the installation. When the electric wire W to be held in the housing 30 together with the component body 21 is installed in the housing 30, the holding force by the moving-direction extending arm portions 52a can be enhanced. Thus, the current sensor 20 can be installed in the housing 30 easily and held in the housing 30 with the enhanced holding force.

(Modification)

Next, a modification of the structure 1 for holding an electric/electronic component according to the embodiment of the invention will be described with reference to FIG. 12.

Figure 12:
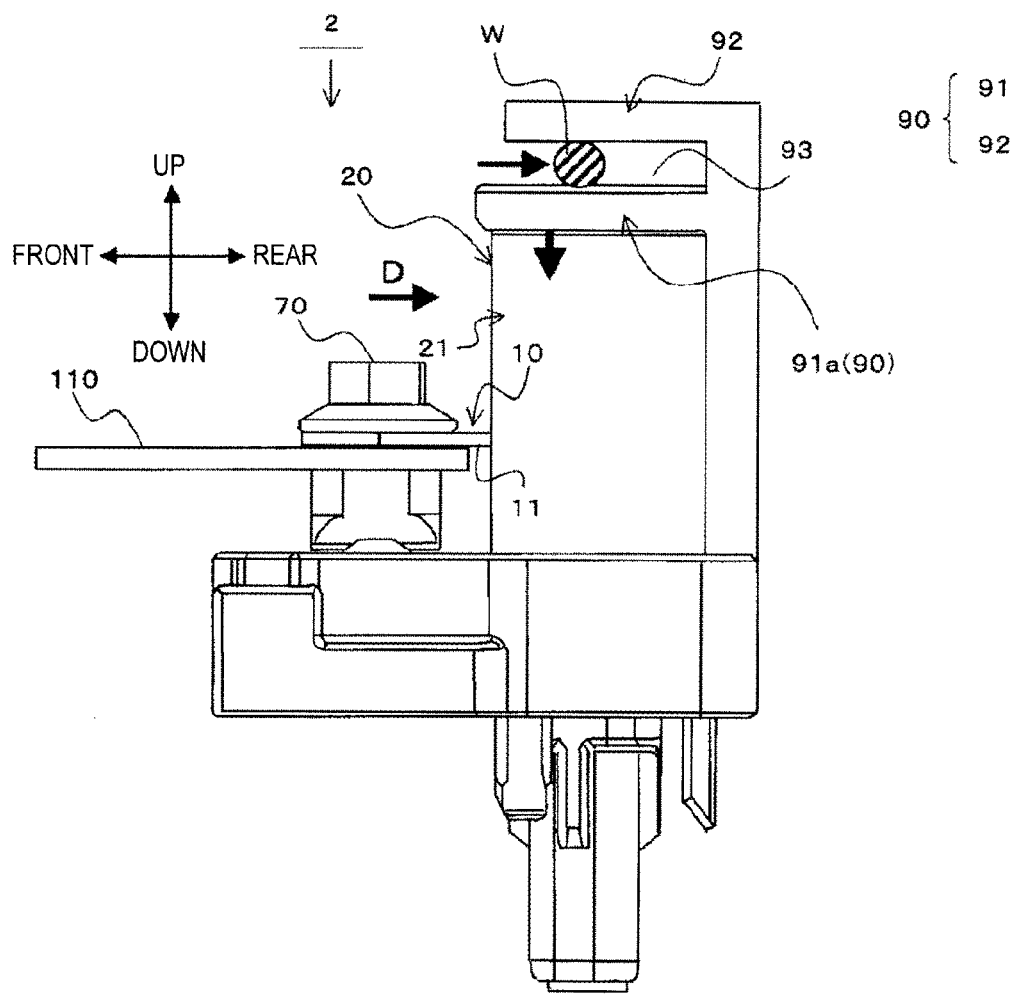
FIG. 12 is a side view of a connector in which a structure for holding an electric/electronic component with an electric wire according to a modification is installed.

FIG. 12 is a side view of a connector 200 in which a structure 2 for holding an electric/electronic component with an electric wire according to the modification is installed.

The structure 2 for holding an electric/electronic component with an electric wire according to the modification is different from the structure 1 for holding an electric/electronic component with an electric wire according to the embodiment at the point that component holding portions 90 are different.

The other configuration is similar to that of the embodiment, and constituent parts the same as those in the embodiment are referenced correspondingly.

Each component holding portion 90 includes a holding arm portion 91 and an electric wire pressing wall portion 92.

The holding arm portion 91 includes a moving-direction extending arm portion 91a extending like an arm in the installation movement direction D so that, of the moving-direction extending arm portion 91a, the front end side on one side surface 21a side of the component body 21 can serve as a port from which the component body 21 is attached. That is, the holding arm portion 91 has a configuration in which the continuous arm portion 52b is not provided.

The electric wire pressing wall portion 92 consists of a wall that is provided so that a gap where the electric wire W is inserted and disposed can be formed between the electric wire pressing wall portion 92 and the holding arm portion 91. More specifically, the electric wire pressing wall portion 92 is a wall that is provided so that a gap 93 where the electric wire W is inserted and disposed to press the moving-direction extending arm portion 91a can be formed between the electric wire pressing wall portion 92 and the moving-direction extending arm portion 91a.

In the structure 2 for holding an electric/electronic component with an electric wire according to the modification, when the current sensor 20 is installed in the housing 30, the component body 21 is disposed in an installation position, and the electric wire W is then disposed in the gap 93 so that the moving-direction extending arm portions 91a can press the one side surface 21a of the component body 21. Accordingly, when the component body 21 is moving to the installation position, the force with which the moving-direction extending arm portions 91a press the one side surface 21a can be adjusted to be small enough not to interfere with the installation. When the electric wire W to be held in the housing 30 together with the component body 21 is installed in the housing 30, the holding force by the moving-direction extending arm portions 91a can be enhanced. Thus, in the same manner as in the structure 1 for holding an electric/electronic component with an electric wire according to the embodiment, the current sensor 20 can be installed in the housing 30 easily and held in the housing 30 with the enhanced holding force.

The embodiments of the invention show examples of structures 1, 2 for holding an electric/electronic component with an electric wire using the current sensor 20 as the electric/electronic component with the electric wire. However, the invention is not limited thereto, but another electric/electronic component may be used as long as it is an electric/electronic component with an electric wire W.

In addition, the embodiments of the invention show examples of structures 1, 2 for holding an electric/electronic component with an electric wire using the current sensor 20 as the electric/electronic component with the electric wire and in which the electric wire W attached to the inside of the component body 21 can be extracted to the outside. However, the invention is not limited thereto, but the electric/electronic component with the electric wire may have a structure in which the electric wire W is removably attached to the component body.

The embodiments of the invention show examples of structure 1, 2 for holding an electric/electronic component with an electric wire including two holding arm portions 52, 91. However, the invention is not limited thereto, but the structure for holding an electric/electronic component with an electric wire may include at least one holding arm portion 52, 91.

Although the invention attained by the inventor has been described specifically based on the above-described embodiment of the invention, the invention is not limited to the above-described embodiment of the invention, but various changes may be made without departing from the scope of the invention.

What is claimed is:

1. A structure for holding an electric/electronic component with an electric wire by a housing, the electric/electronic component comprising a component body to which the electric wire is attached, said structure comprising:
   a component holding portion provided in the housing to hold the electric/electronic component,
   wherein the component holding portion comprises:
      a holding arm portion comprising a moving-direction extending arm portion having an arm shape extending in a moving direction in which the component body is moved to be installed in the housing through an attachment port for the component body defined on a side corresponding to one side surface of the component body and on a front end side of the holding arm portion; and
      an electric wire pressing wall portion comprising a wall which defines a gap between the electric wire pressing wall portion and the holding arm portion to allow the electric wire to be inserted and disposed, and
   wherein in a state in which the electric/electronic component is installed in the housing, the component body is placed in an installation position, and the electric wire is disposed to expand the gap, whereby the holding arm is deformed such that the moving-direction extending arm portion presses the one side surface.

2. The structure for holding an electric/electronic component with an electric wire according to claim 1,
   wherein the holding arm portion further comprises:
      a continuous arm portion which is bent with respect to the moving-direction extending arm portion on a rear side opposite to the front end side in the moving direction and which has an arm shape continuous to the moving-direction extending arm portion,
   wherein the gap is formed between the electric wire pressing wall portion and the continuous arm portion, and
   wherein in the state in which the electric/electronic component is installed in the housing, the electric wire disposed in the gap presses the continuous arm portion to incline the continuous arm portion toward the component body such that the moving-direction extending arm portion presses the one side surface of the component body.

3. The structure for holding an electric/electronic component with an electric wire according to claim 1,
   wherein a distance between the holding arm portion and the electric wire pressing wall portion forming the gap is adjusted to be smaller than an outer diameter of the electric wire.

4. The structure for holding an electric/electronic component with an electric wire according to claim 1, wherein a conductive member comprising an electric connection portion to be electrically connected to a connection counterpart is installable in the housing, wherein the electric/electronic component comprises a current sensor which has a measurement hole which is formed to penetrate the component body in the moving direction and to which the electric connection portion is inserted for measuring an electric current of the electric connection portion, and wherein in the state in which the component body is installed in the housing, the electric connection portion is inserted into the measurement hole.

\* \* \* \* \*